(12) United States Patent
Hsu

(10) Patent No.: US 9,536,972 B2
(45) Date of Patent: Jan. 3, 2017

(54) TRENCH POWER MOSFET AND MANUFACTURING METHOD THEREOF

(71) Applicant: SUPER GROUP SEMICONDUCTOR CO., LTD., Hsinchu County (TW)

(72) Inventor: Hsiu-Wen Hsu, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 14/862,754

(22) Filed: Sep. 23, 2015

(65) Prior Publication Data
US 2016/0190264 A1 Jun. 30, 2016

(30) Foreign Application Priority Data

Dec. 31, 2014 (TW) .............................. 103146590 A

(51) Int. Cl.
| | |
|---|---|
| *H01L 29/78* | (2006.01) |
| *H01L 29/66* | (2006.01) |
| *H01L 29/423* | (2006.01) |
| *H01L 27/088* | (2006.01) |
| *H01L 21/8234* | (2006.01) |
| *H01L 29/10* | (2006.01) |

(Continued)

(52) U.S. Cl.
CPC ... *H01L 29/4236* (2013.01); *H01L 21/823437* (2013.01); *H01L 21/823462* (2013.01); *H01L 27/088* (2013.01); *H01L 29/086* (2013.01); *H01L 29/1095* (2013.01); *H01L 29/42368* (2013.01); *H01L 29/511* (2013.01); *H01L 29/66734* (2013.01); *H01L 29/7813* (2013.01)

(58) Field of Classification Search
CPC .......... H01L 29/00; H01L 29/66; H01L 29/08; H01L 29/78; H01L 29/10; H01L 29/423; H01L 29/51; H01L 29/088; H01L 29/4236; H01L 29/66734; H01L 29/7813; H01L 29/1095; H01L 29/511; H01L 29/42368; H01L 29/086; H01L 29/7802; H01L 29/66712; H01L 29/7827; H01L 29/6666; H01L 29/0634
USPC ................. 257/329, 330, 331, 332, 334, 337
See application file for complete search history.

(56) References Cited

U.S. PATENT DOCUMENTS

| | | | |
|---|---|---|---|
| 2004/0089910 A1 | 5/2004 | Hirler et al. | |
| 2006/0014349 A1* | 1/2006 | Williams | ............ H01L 29/4236 438/270 |

(Continued)

FOREIGN PATENT DOCUMENTS

TW M480763 U 6/2014

*Primary Examiner* — Chuong A Luu
(74) *Attorney, Agent, or Firm* — Li & Cai Intellectual Property (USA) Office

(57) ABSTRACT

A trench power MOSFET and a manufacturing method thereof are provided. The gate of the trench power MOSFET includes an upper doped region, a lower doped region and a middle region interposed therebetween. The upper has a conductive type reverse to that of the lower doped region, and the middle region is an intrinsic or lightly-doped region to form a PIN, $P^+/N^-$ or $N^+/P^-$ junction. As such, when the trench power MOSFET is in operation, a junction capacitance formed at the PIN, $P^+/N^-$ or $N^+/P^-$ junction is in series with the parasitic capacitance. Accordingly, the gate-to-drain effective capacitance may be reduced.

8 Claims, 14 Drawing Sheets

(51) Int. Cl.
    *H01L 29/51*    (2006.01)
    *H01L 29/08*    (2006.01)

(56) References Cited

U.S. PATENT DOCUMENTS

2009/0121285 A1    5/2009   Kawamura et al.
2013/0248982 A1*   9/2013   Grivna ............... H01L 29/7842
                                                         257/329

* cited by examiner

TRENCH POWER MOSFET AND MANUFACTURING METHOD THEREOF

BACKGROUND OF THE INVENTION

1. Field of the Invention

The present invention relates to a power metal-oxide-semiconductor field-effect transistor (MOSFET) and manufacturing method thereof; in particular, to a trench power MOSFET and manufacturing method thereof.

2. Description of Related Art

Power metal-oxide-semiconductor field-effect transistors (Power MOSFET) are widely implemented in the switching devices of electric devices, such as power supply, rectifier or low voltage motor controllers and the like. The current power MOSFET is designed to have a vertical structure to improve the packing density. The power MOSFET having trench gate structure not only results in higher packing density, but also has lower on-state resistance. One of the advantages of the trench power MOSFET is that it is capable of controlling the operation of devices with low-power consumption.

The working loss of power MOSFET is categorized into a switching loss and a conducting loss. In addition, an intrinsic gate-to-drain capacitance (Cgd) is one of the important parameters affecting the switching loss. When the intrinsic gate-to-drain capacitance is too high, the switching loss increases, which may limit the switching speed of the power trench MOSFET and may lead to the trench power MOSFET being unfavorable to be implemented in high frequency circuits.

SUMMARY OF THE INVENTION

The object of the present invention is to provide a trench power MOSFET and a manufacturing method thereof, which can decrease the effective capacitance between the gate and the drain by using a gate having a PIN, $P^+/N^-$, or $N^+/P^-$ junction formed therein.

In order to achieve the aforementioned objects, according to an embodiment of the present invention, a trench power MOSFET is provided. The trench power MOSFET includes a substrate, an epitaxial layer and a plurality of trench transistor units. The epitaxial layer is formed on the substrate and the plurality of the trench transistor units is formed in the epitaxial layer. Each of the trench transistor units includes a trench gate structure having a trench and a gate. The trench is formed in the epitaxial layer and an insulating layer is formed on an inner wall of the trench. The gate formed in the trench includes an upper doped region, a middle region and a lower doped region, in which the upper and lower doped regions have different doping types, and the middle region has smaller carrier concentration than that of each of the upper and lower doped regions. In addition, each of the trench transistor units includes a source region and a body region. The source region and the body region are formed in the epitaxial layer and adjacent to side walls of the trench gate structure and the body region is formed under the source region.

According to another embodiment of the present invention, a manufacturing method of the trench power MOSFET is provided. The manufacturing method includes the steps of providing a substrate; forming an epitaxial layer on the substrate; performing a base doping process in the epitaxial layer to form a first doped region; forming a plurality of trench gate structures in the epitaxial layer and the first doped region, in which each of the trench gate structures includes an upper doped region, a lower doped region, and a middle region located therebetween, and the upper and lower doped region have different doping types, and the middle region has smaller carrier concentration than that of each of the upper and lower doped regions; and performing a source implantation to implant the first doped region and form a source region and a body region, in which the source region is located above the body region.

To sum up, the trench power MOSFET and the manufacturing method thereof in accordance with the present invention make the formation of a PIN, $P^+/N^-$ or $N^+/P^-$ junction in the gate. Since a junction capacitance (Cj) of the PIN, $P^+/N^-$ or $N^+/P^-$ junction is generated under reverse bias, and the junction of capacitance is in series with the parasitic capacitance (Cp), the effective capacitance between the gate and the drain can be reduced.

In order to further the understanding regarding the present invention, the following embodiments are provided along with illustrations to facilitate the disclosure of the present invention.

DETAILED DESCRIPTION OF THE PREFERRED EMBODIMENTS

Figure 1A:
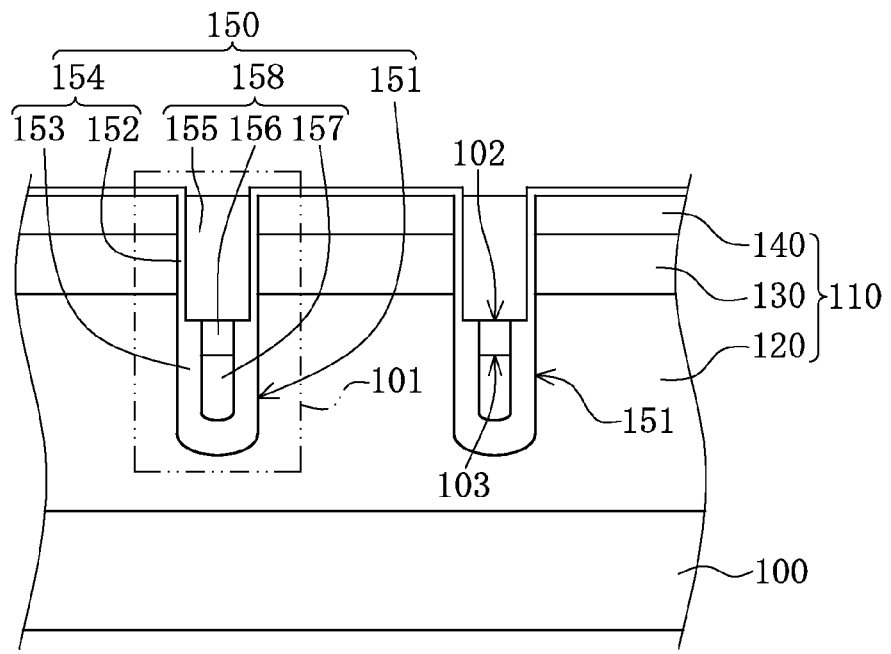
FIG. 1A shows a local sectional view of a trench power MOSFET provided in accordance with an embodiment of the present invention.

The aforementioned illustrations and following detailed descriptions are exemplary for the purpose of further explaining the scope of the present invention. Other objectives and advantages related to the present invention will be illustrated in the subsequent descriptions and appended drawings. In reference to the disclosure herein, for purposes of convenience and clarity only, directional terms, such as, top, bottom, left, right, up, down, over, above, below, beneath, rear, front, distal, and proximal are used with respect to the accompanying drawings. Such directional terms should not be construed to limit the scope of the invention in any manner. In addition, the same reference numerals are given to the same or similar components.

FIG. 1A shows a local sectional view of a trench power MOSFET provided in accordance with an embodiment of the present invention. The trench power MOSFET includes a substrate 100, an epitaxial layer 110 and a plurality of trench transistor units 101 (two trench transistor units are shown in FIG. 1A).

The substrate 100 is doped with a higher concentration of first conductivity type impurities to form a first heavily doped region. The first heavily doped region can serve the function of the drain of the trench power MOSFET, and may occupy a local region or the overall region of the substrate 100. In the instant embodiment, the first heavily doped region occupies the overall region of the substrate 100, which is only used as an example, but not so as to limit the scope of the invention. The aforementioned first conductivity type impurities may be N-type or P-type conductivity impurities. If the substrate 100 is silicon substrate, the N-type conductivity impurities may be Group V ions such as phosphorus ion or arsenic ion, and the P-type conductivity impurities may be Group III ions such as boron ion, aluminum ion or gallium ion.

If the trench power MOSFET is n-type, the substrate 100 is doped with N-type conductivity impurities, whereas if the trench power MOSFET is p-type, the substrate 100 is doped with P-type conductivity impurities. In the embodiment of the present invention, the N-type trench power MOSFET is taken as an example to describe the invention.

The epitaxial layer 110 is formed on the substrate 100 and doped with a lower concentration of the first conductivity type impurities. That is, taking the N-type trench power MOSFET for example, the substrate 100 is a heavily N-type doping (N$^+$) substrate and the epitaxial layer 110 is a lightly N-type doping (N$^-$) layer. On the contrary, taking the P-type trench power MOSFET for example, the substrate 100 is a heavily P-type doping (P$^+$) substrate and the epitaxial layer 110 is a lightly P-type doping (P$^-$) layer.

The plurality of trench transistor units 101 are formed in the epitaxial layer 110. Each of the trench transistor units 101 includes a drift region 120, a body region 130, a source region 140 and a trench gate structure 150. The body region 130 and the source region 140 are formed in the epitaxial layer 110 enclosing the side wall of the trench gate structure 150.

Furthermore, the body region 130 is formed by implanting second conductivity type impurities into the epitaxial layer 110, and the source region 140 is formed in an upper portion of the body region 130 by implanting high-concentration first conductivity type impurities into the body region 130. For example, in the N-type trench power MOSFET, the body region 130 is a P-type dopant region, i.e., P-well, and the source region 140 is a N-type dopant region. Additionally, the doping concentration of the body region 130 is lower than that of the source region 140.

That is to say, by doping different conductivity type impurities in different regions and making the different regions have different concentrations, the epitaxial layer 110 can be divided into the drift region 120, the body region 130, and the source region 140. The body region 130 and the source region 140 are immediately adjacent to the side walls of the trench gate structure 150, and the drift region 120 is located nearer to the substrate 100. In other words, the body region 130 and the source region 140 are located at an upper portion of the epitaxial layer 110, and the drift region 120 is located at a lower portion of the epitaxial layer 110.

Each of the trench gate structures 150 includes a trench 151, an insulating layer 154 and a gate 158. The trench 151 is formed in the epitaxial layer 110. The insulating layer 154 and the gate 158 are formed at the inside of the trench 151. Specifically, the insulating layer 154 is formed to conformally cover an inner wall of the trench 151 so that the gate 158 can be isolated from the epitaxial layer 110.

Notably, the trench transistor unit 101 of the embodiment of the present invention has a deep trench structure. That is, the trench 151 extends from a top surface of the epitaxial layer 110 to a depth greater than that of the body region 130, i.e., the trench 151 extends into the drift region 120 so that the bottom of the trench 151 is closer to the substrate 110.

The aforementioned deep trench structure helps increase the breakdown voltage of the trench transistor unit 101, whereas the deep trench structure may increase the parasitic capacitance (Cp) between gate and drain. Accordingly, the gate 158 in accordance with the embodiment of the present invention has an upper doped region 155, a lower doped region 157, and a middle region 156 interposed therebetween, such that a junction capacitance (Cj) is formed at the inside of the gate 158 to series connect to the parasitic capacitance (Cp) so that the gate-to-drain effective capacitance can be reduced.

Specifically, the upper doped region 155 and the lower doped region 157 respectively include different conductivity-type impurity ions and thus have different conductive types. In one embodiment, each of the upper doped region 155 and the lower doped region 157 has a doping concentration of about $10^{19}$ cm$^{-3}$.

In the instant embodiment, the middle region 156 has a smaller carrier concentration than that of each of the upper and lower doped regions 155 and 157. The middle region 156 can be an intrinsic region or a lightly-doped region.

When the middle region 156 is the intrinsic region, the upper doped region 155, the middle region 156, and the lower doped region 157 form a PIN junction in the gate 158, thus resulting in a depletion region at the PIN junction. As such, a junction capacitance (Cj) for series connecting the parasitic capacitance (Cp) can be formed at the PIN junction. In addition, the middle region 156, which is intrinsic, has higher resistance, and can be viewed as an insulating layer. As such, the junction capacitance caused at the PIN junction is lower.

Additionally, before a bias is applied to the gate 158, the depletion region has a substantially similar dimension to that of the middle region 156. That is, the depletion region has a range between a first boundary 102 and a second boundary 103. When a reverse bias is applied, the depletion region is enlarged and extends beyond the first boundary 102 and the second boundary 103 of the middle region 156 and into the upper doped region 155 and lower doped region 157. Therefore, the larger the applied reverse bias, the smaller the junction capacitance (Cj) caused at the PIN junction in the gate 158.

However, the range occupied by the middle region 156 in the gate 158 has to be limited to avoid other impacts on the electrical properties of the trench power MOSFET, such as the result of increasing on-resistance between the source and drain. In one embodiment, the thickness of the middle region 156 ranges from 0.1 to 1 μm.

When the middle region 156 is the lightly-doped region, the middle region 156 has a doping concentration of lower than $10^{17}$ cm$^{-3}$. In one embodiment, the middle region 156 has a conductive type reverse to that of the upper doped region 155, but the same as that of the lower doped region 157. Accordingly, a P$^+$/N$^-$ or N$^+$/P$^-$ junction between the middle region 156 and the upper doped region 155 is formed, and substantially located at the first boundary 102 of the middle region 156. A depletion region also can be caused at the P$^+$/N$^-$ or N$^+$/P$^-$ junction so that the junction capacitance (Cj) serially connected to the parasitic capacitance (Cp) can be generated in the gate 158, thus resulting in lower gate-to-drain effective capacitance (Cgd).

In addition, because a carrier concentration of the upper doped region 155 is much greater than that of the middle region 156, most of the depletion region formed at the P$^+$/N$^-$ or N$^+$/P$^-$ junction is located in the middle region 156. When the reverse bias is applied, the depletion region is enlarged and extends beyond the first boundary 102 and into the upper doped region 155. Accordingly, the junction capacitance (Cj) generated at the P$^+$/N$^-$ or N$^+$/P$^-$ junction formed in the gate 158 decreases as the applied reverse bias increases.

Consequently, no matter whether a P$^+$/N$^-$, N$^+$/P$^-$ or PIN junction is formed in the gate 158, the carrier concentration of the middle region 156 is much smaller than that of the upper and lower doped region 155 and 157. In comparison with a PN junction, the depletion region caused by P$^+$/N$^-$, N$^+$/P$^-$ or PIN junction has greater range, thus resulting in lower junction capacitance (Cj). Furthermore, when the reverse bias is applied, the depletion region is enlarged so that the junction capacitance (Cj) further decreases. In some examples, when the junction capacitance (Cj) generated at the PIN junction is less than the parasitic capacitance (Cp), the impact on the trench power MOSFET caused by the parasitic capacitance (Cj) can be even almost attenuated due to the lower junction capacitance (Cj) generated at the PIN junction.

In another embodiment, the upper doped region 155 can have a doping concentration with a gradient. Specifically, the doping concentration of the upper doped region 155 gradually increases along a direction from near the middle region 156 to far away from the middle region 156. That is, the doping concentration near the top of the upper doped region 155 is greater than that near the middle region 156. As such, the depletion region formed between the middle region 156 and upper doped region 155 can be enlarged and much lower junction capacitance (Cj) can be generated.

In the instant embodiment, the first boundary 102 of the middle region 156 is located at a level just below the lowest edge of the body region 130. The position of the first boundary 102 may be associated with the gate-to-drain effective capacitance of the trench power MOSFET, and can be determined according to the characteristic demands of the device. For example, the first boundary 102 located at a level near to or just below the lowest edge of the body region 130 may result in the attenuation of the gate-to-drain effective capacitance. As such, the accumulation of the gate-to-drain charge (Qgd) can be reduced and the switching loss can be minimized.

In another embodiment, the middle region 156 has the conductive type reverse to that of the lower doped region 157, but the same as that of the upper doped region 155. That is, a P$^-$/N$^+$ or N$^-$/P$^+$ junction between the middle region 156 and the lower doped region 157 is formed, and substantially located at the second boundary 103 of the middle region 156. Similarly, a depletion region can be formed at the P$^-$/N$^+$ or N$^-$/P$^+$ junction. In comparison with the prior embodiment, the depletion region in the instant embodiment is located nearer to the bottom of the trench 151. Similar to the prior embodiment, the junction capacitance (Cj) serially connected to the parasitic capacitance (Cp) can be generated at the depletion region and can be capable of reducing the gate-to-drain effective capacitance (Cgd).

Figure 1B:
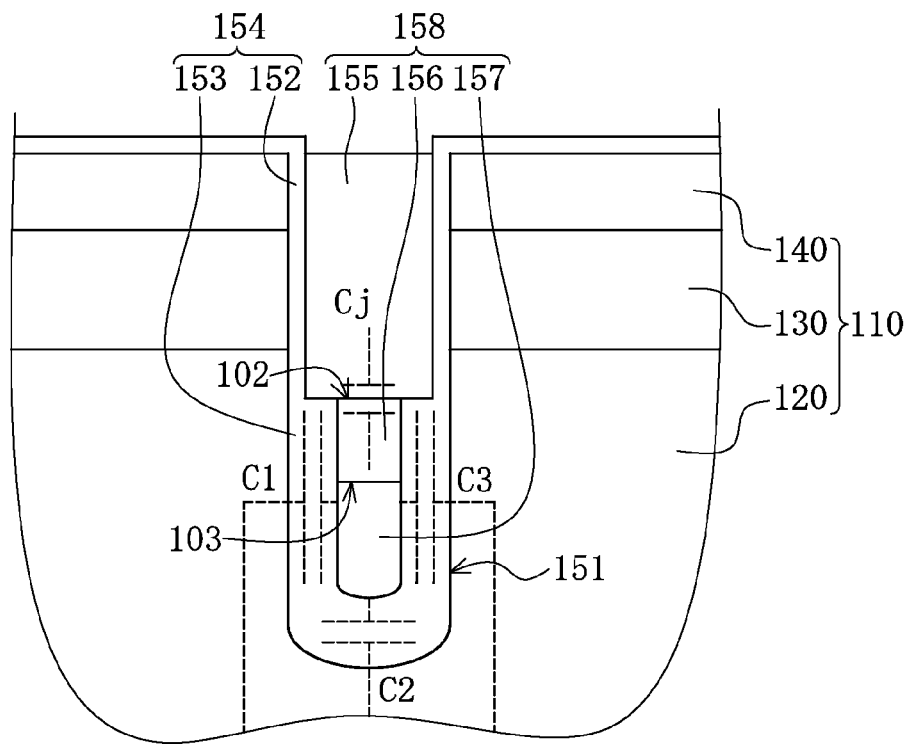
FIG. 1B shows a local sectional view of a trench power MOSFET provided in accordance with an embodiment of the present invention.

Please refer to FIG. 1B, which shows a local sectional view of a trench power MOSFET provided in accordance with an embodiment of the present invention. As shown in FIG. 1B, because of the deep trench structure, a parasitic capacitance Cp is caused by a parallel connection of a first capacitor C1, a second capacitor C2 and a third capacitor C3. That is, the value of the parasitic capacitance is equivalent to a sum of the values of the first capacitor C1, the second capacitor C2 and the third capacitor C3, i.e., Cp, C1, C2 and C3 satisfy the following relation: Cp=C1+C2+C3.

As mentioned previously, the switching speed of the power trench MOSFET may be attenuated due to a too high value of the intrinsic gate-to-drain capacitance. Accordingly, the gate-to-drain effective capacitance (Cgd) can be reduced by forming the junction capacitance (Cj) serially connected to the parasitic capacitance (Cp) in the gate 158.

Specifically, the gate-to-drain effective capacitance (Cgd), the parasitic capacitance (Cp), and the junction capacitance (Cj) satisfy the following relation: Cgd=(Cp×Cj)/(Cp+Cj). Because the value of the gate-to-drain effective capacitance (Cgd) is smaller than that of the intrinsic parasitic capacitance (Cp), the switching loss of the trench power MOSFET can be reduced.

In addition, it is worth noting that by forming the junction capacitance (Cj) among the upper doped region 155, the middle region 156, and the lower doped region 157 in series with the parasitic capacitance (Cp), the gate-to-drain effective capacitance (Cgd) can be reduced. Although the position or the shape of the junction capacitance may be slightly changed due to the implantation or diffusion process, the existence of the junction capacitance is capable of reducing the gate-to-drain effective capacitance.

Furthermore, in order to apply the reverse bias to the gate 158 so as to generate much lower junction capacitance (Cj) when the trench power MOSFET is in the ON state, the conductivity type of the impurities in the upper doped region 155 is the same as that of the impurities in the source region 140, whereas it is different from that of the impurities in the body region 130 and the lower doped region 157.

Taking the N-type trench power MOSFET for example, both of the source region 140 and the upper doped region 155 are doped with N-type conductivity impurities, whereas the lower portion 157 are doped with P-type conductivity impurities. That is, in the instant embodiment, both of the upper doped region 155 and the source region 140 are N-type doped regions, and the lower doped region 157 is a P-type doped region. The middle region 156 can be an intrinsic region or a lightly P-type doped region. When the middle region 156 is a lightly P-type doped region, a P$^-$/N$^+$ junction is formed at the first boundary 102.

When a positive bias is applied to the upper doped region 155 of the gate 158, the electrons in the body region 130 accumulate at the side walls of the trench 151 and form a channel between the source region 140 and the drain region so that the trench transistor unit is in ON state. Meanwhile, the width of the depletion region at the first boundary 102 in the gate 158 is enlarged due to the reverse bias, thus generating the lower junction capacitance (Cj). Conversely, taking the P-type trench power MOSFET for example, both of the source region 140 and the upper doped region 155 are doped with P-type conductivity impurities, whereas both of the body region 130 and the lower doped region 157 are doped with N-type conductivity impurities. The middle region 156 can be an intrinsic region or a lightly N-type doped region. When the middle region 156 is a lightly N-type doped region, a P$^+$/N$^-$ junction is formed at the first boundary 102.

In addition, taking a lowest plane of the body region 130 as a reference plane, the trench 151 may be substantially divided into an upper portion and a lower portion. In one embodiment, the insulating layer 154 includes an upper insulating layer 152 and a lower insulating layer 153. The upper insulating layer 152 is formed along an upper portion of an inner wall of the trench 151, and the lower insulating layer 153 is formed along a lower portion of the inner wall of the trench 151. Additionally, the middle region 156 and the lower doped region 157 of the gate 158 are formed in the lower portion of the trench 151 and the upper doped region 155 is filled in the upper portion of the trench 151. The upper insulating layer 152 is used to isolate the upper doped region 155 from the body region 130 and the source region 140, and the lower insulating layer 153 is used to isolate both of the middle region 156 and the lower doped region 157 from the drift region 120.

In one embodiment, the thickness of the lower insulating layer 153 is larger than that of the upper insulating layer 152. In such a circumstance, as shown in FIG. 1A, the width of the upper doped region 155 is wider than that of the middle region 156 and the lower doped region 157. Notably, the parasitic capacitance Cp is caused by the parallel connection of the first capacitor C1, the second capacitor C2 and the third capacitor C3, and the values of the first, second and third capacitors C1, C2, and C3 are inversely related to the thickness of the lower insulating layer 153. Accordingly, by making the thickness of the lower insulating layer 153 larger than that of the upper insulating layer 152, the parasitic capacitance (Cp) can be reduced. Additionally, the material for forming the insulating layer 154 is such as silicon dioxide. The gate 158 may be a polysilicon gate.

In the instant embodiment, both of the first boundary 102 and the top end of the lower insulating layer 153 are respectively located at the levels near to the lowest edge of the body region 130. In the embodiment shown in FIG. 1A, the top end of the lower insulating layer 153 and the first boundary 102 are located respectively at levels slightly lower than the lowest edge of the body region 130. In addition, the top end of the lower insulating layer 153 can be located at the level equal to or slightly lower than the top edge (i.e, the first boundary 102) of the middle region 156.

Figure 2A:
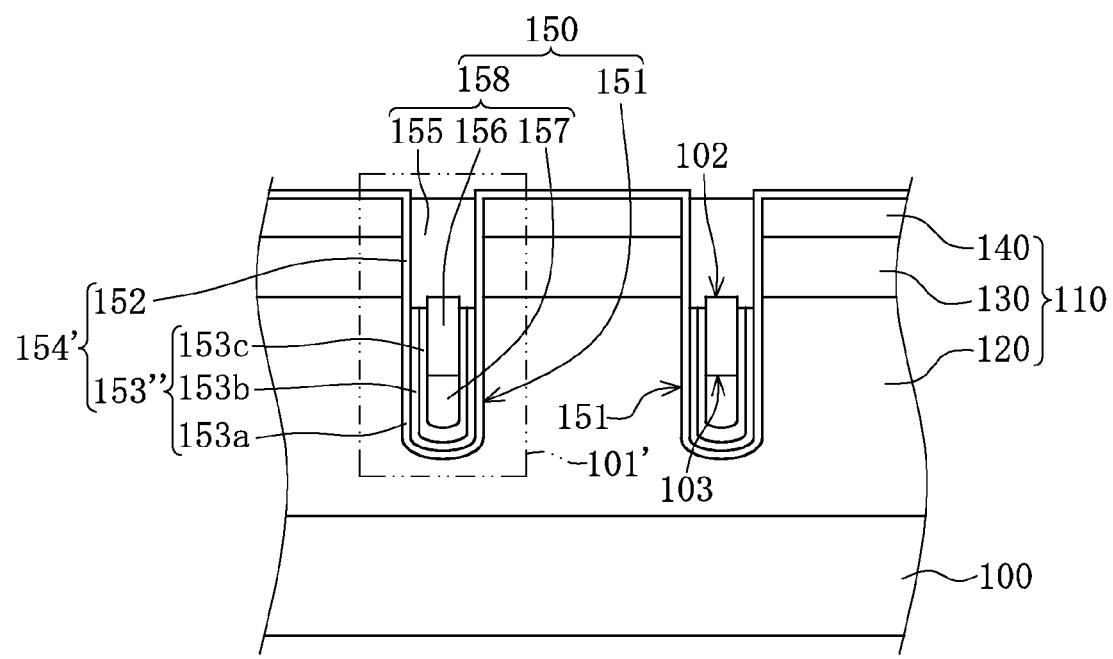
FIG. 2A shows a local sectional view of a trench power MOSFET provided in accordance with another embodiment of the present invention.
Figure 2B:
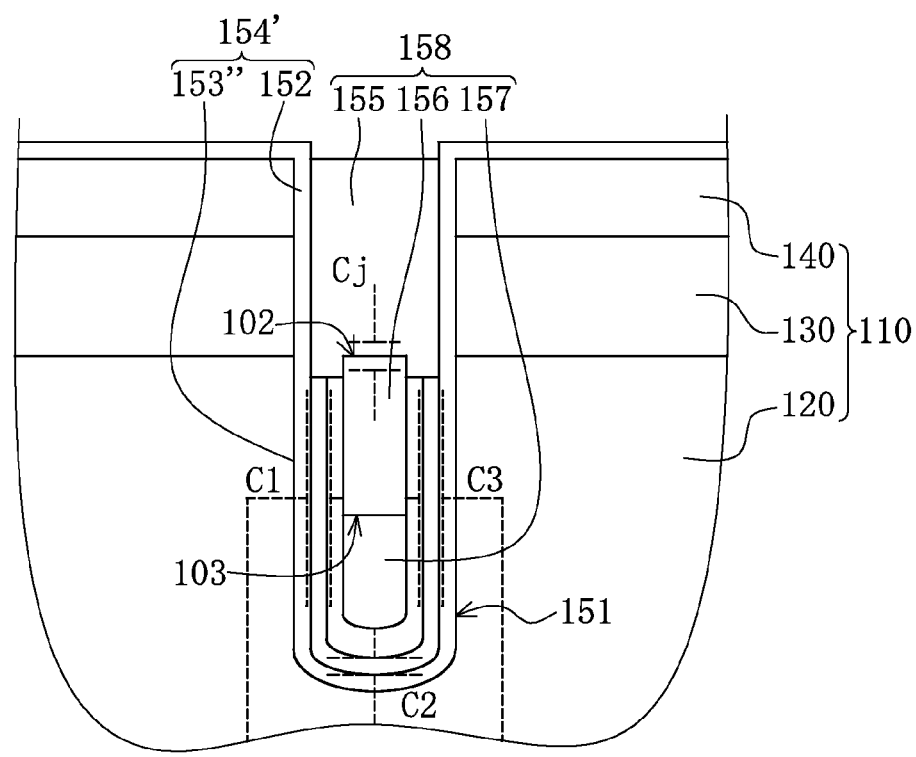
FIG. 2B shows a local sectional view of a trench power MOSFET provided in accordance with another embodiment of the present invention.

Please refer to FIG. 2A and FIG. 2B, which show a local sectional view of a trench power MOSFET provided in accordance with another embodiment of the present invention. In the instant embodiment, the gate 158 has the upper doped region 155, the middle region 156, and the lower doped region 157 form the junction capacitance (Cj) in the gate 158.

The insulating layer 154' of the instant embodiment includes the upper insulating layer 152 and the lower insulating layer 153". A difference between the instant embodiment and the previous embodiment is the lower insulating layer 153" has a multi-layered structure, which includes a first insulating layer 153a, a second insulating layer 153b and a third insulating layer 153c. The second insulating layer 153b is sandwiched between the first insulating layer 153a and the third insulating layer 153c. The material of the first insulating layer 153a, the second insulating layer 153b and the third insulating layer 153c may be oxide or nitride. For example, both of the first insulating layer 153a and the third insulating layer 153c can be oxide layers, and the second insulating layer 153b can be a nitride layer so as to prevent the impurities doped in the lower doped region 157 from diffusing into the drift region 120 and so avoid affecting the operation of the trench power MOSFET. Furthermore, the top end of the lower insulating layer 153" is located at a level near to the lowest edge of the body region 130. In the embodiments shown in FIG. 2A and FIG. 2B, the top end of the lower insulating layer 153" is located at a level just below the lowest edge of the body region 130.

Figure 3:
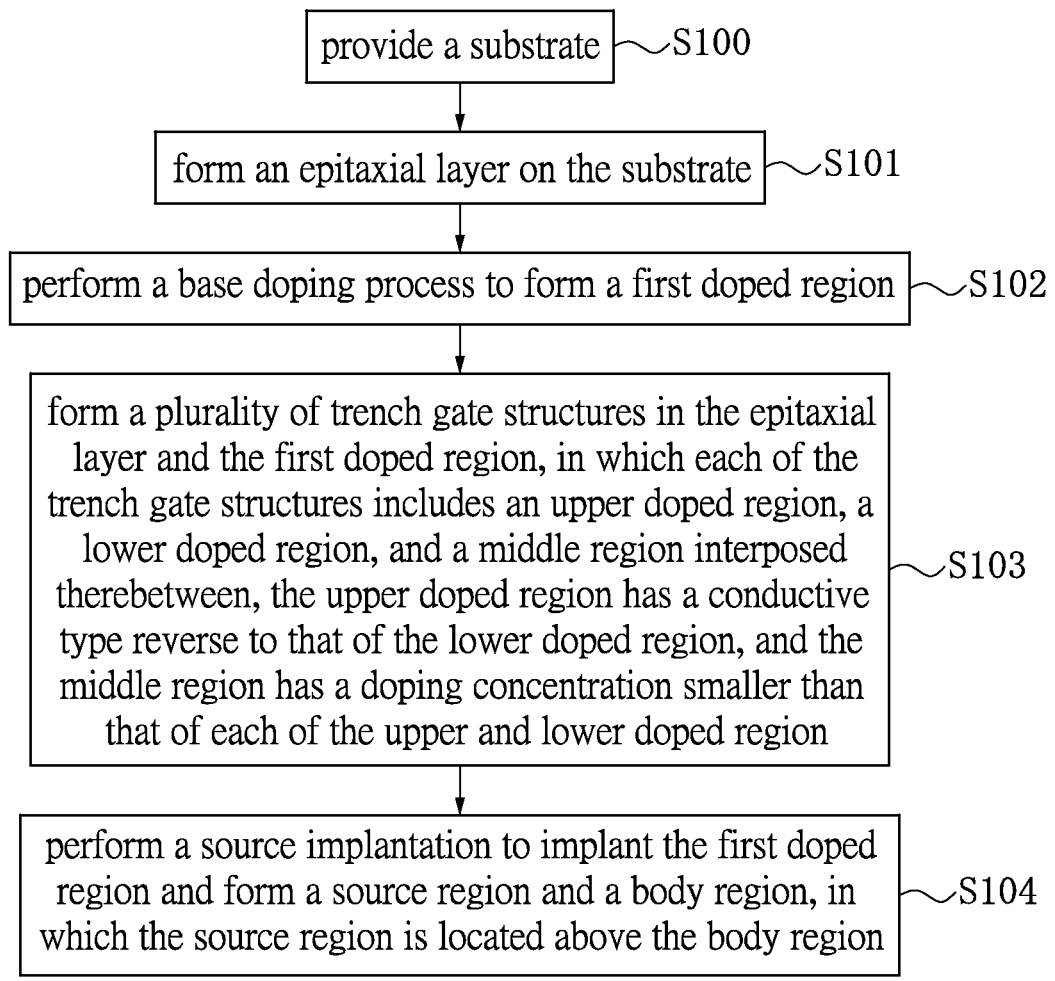
FIG. 3 is a flowchart illustrating the manufacturing method of the trench power MOSFET provided in accordance with an embodiment of the present invention.

In addition, a manufacturing method of the trench power MOSFET is provided in the embodiment of the present invention. Please refer to FIG. 3 and FIGS. 4A to 4M. FIG. 3 is a flowchart illustrating the manufacturing method of the trench power MOSFET provided in accordance to an embodiment of the present invention. FIG. 4A~FIG. 4M respectively show schematic sectional views of the trench power MOSFET in different steps of the manufacturing method provided in accordance to an embodiment of the present invention.

Figure 4A:
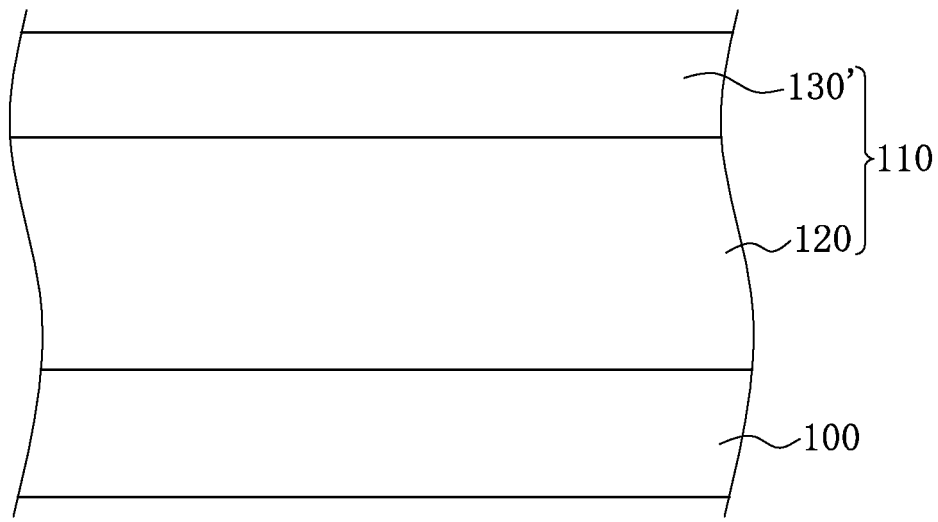
FIGS. 4A to 4M respectively show schematic sectional views of the trench power MOSFET in different steps of the manufacturing method provided in accordance with an embodiment of the present invention.

In step S100, a substrate is provided. Next, in step S101, an epitaxial layer is formed on the substrate. Please refer to FIG. 4A. FIG. 4A illustrates the substrate 100 and the epitaxial layer 110 disposed on the substrate 100. The substrate 100 is such as a silicon substrate doped with a higher concentration of first conductivity type impurities to form a first heavily doped region to serve the function of the drain of the trench power MOSFET. The epitaxial layer 110 has a lower doping concentration.

Subsequently, in step S102, a base doping process is carried out in the epitaxial layer 110 to form a first doped region 130' which is formed at one side far from the substrate 100 and can serve as a body region 130 in the following steps, as shown in FIG. 4A.

Subsequently, in step S103, a plurality of trench gate structures are formed in the epitaxial layer, and each of the trench gate structures includes an upper doped region, a lower doped region, and a middle region interposed therebetween. The upper doped region has a conductive type reverse that of the lower doped region, and a carrier concentration of the middle region is smaller than that of each of the upper and lower doped regions. For step S103, FIGS. 4B to 4L illustrate the process steps in greater detail.

Figure 4B:
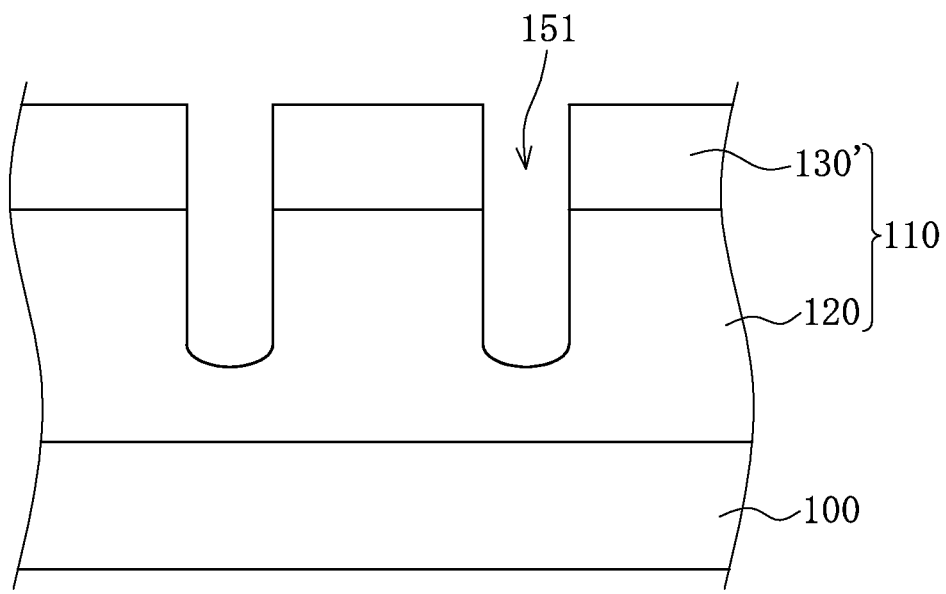

Please refer to FIG. 4B. A plurality of trenches 151 are formed in the epitaxial layer 110. In one embodiment, a mask (not shown in FIG. 4B) is used to define the positions of the trenches 151 in advance, and the trenches 151 may be formed in the epitaxial layer 110 by performing dry etching or wet etching Notably, in the instant embodiment, before the trench gate structure 150 is formed, the epitaxial layer 110 can be doped with conductivity impurities to form a first doped region 130' in preparation for forming the body region 130.

Figure 4C:
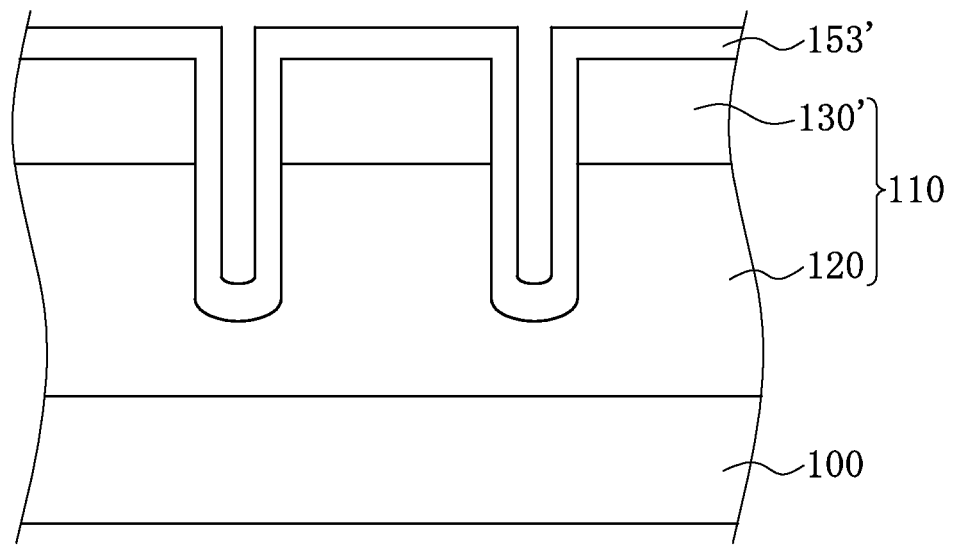

Subsequently, as shown in FIGS. 4C to 4H, a lower insulating layer 153, which is also shown in FIG. 1A, is formed along a lower portion of the inner wall of the trench 151. Specifically, as shown in FIG. 4C, an oxide layer 153' is blanket formed on the epitaxial layer 110. The oxide layer 153' may be a silicon dioxide ($SiO_2$) layer and may be formed by performing a thermal oxidation process. In another embodiment, the oxide layer 153' may be formed by chemical vapor deposition (CVD). The oxide layer 153' is formed on a surface of the epitaxial layer 110 and covers the inner walls and the bottom of the trench 151.

Figure 4D:
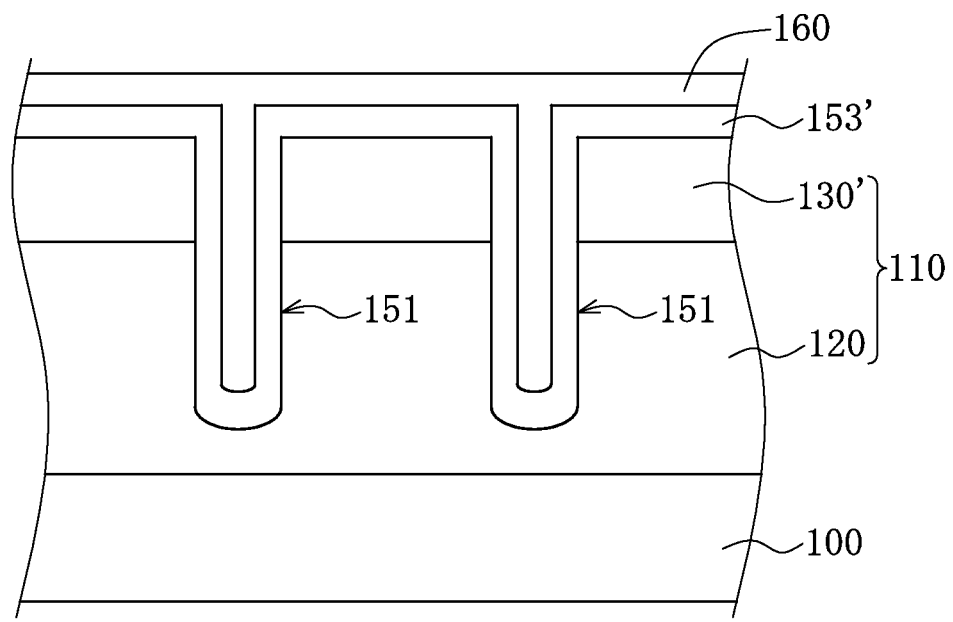

Please refer to FIG. 4D. A polysilicon structure 160 is formed on the oxide layer 153' and filled in the trench 151. The polysilicon structure 160 may be a doped polysilicon structure or non-doped polysilicon structure.

Figure 4E:
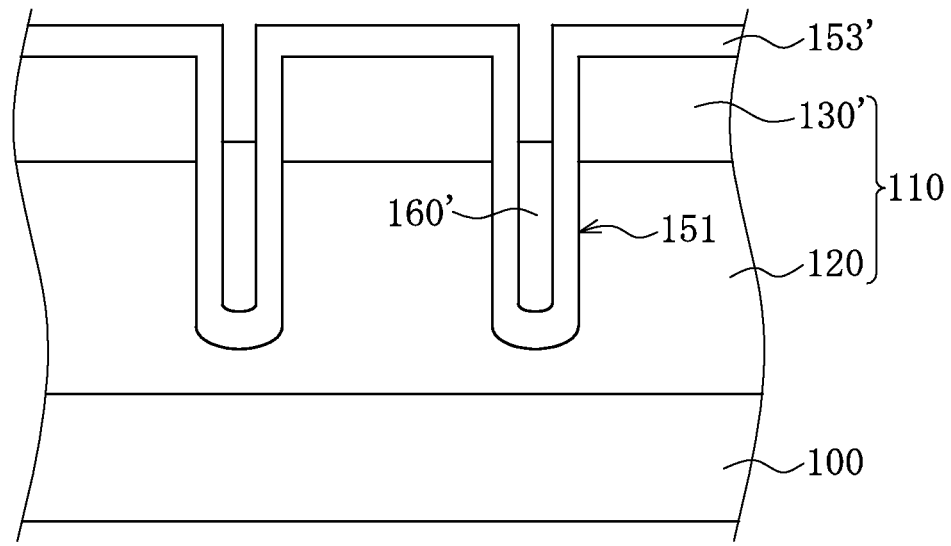

Subsequently, as shown in FIG. 4E, a portion of the polysilicon structure 160 covering the oxide layer 153' on the outside of the trench 151 and located in the upper portion of the trench 151 is removed by performing an etch back process, and the residual polysilicon structure 160' is left in the lower portion of the trench 151. As shown in FIG. 4E, the top end of the polysilicon structure 160' left in the lower portion of the trench 151 is located at a level higher than the lowest edge of the first doped region 130'.

Figure 4F:
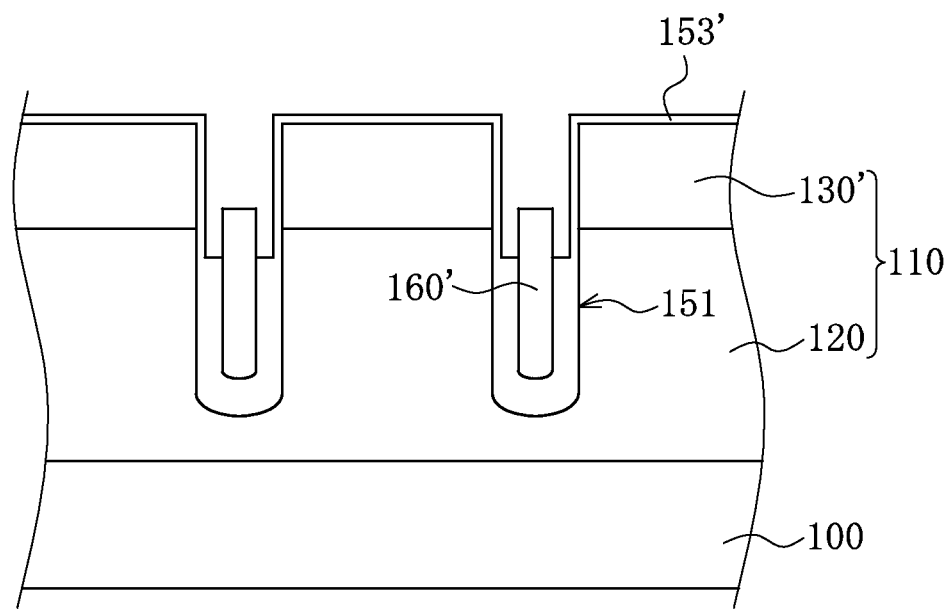

Please refer to FIG. 4F. An etching process is carried out using the residual polysilicon structure 160' as a mask to thin the thickness of the oxide layer 153' covering the surface of the epitaxial layer 110 and the upper portion of the inner walls of the trench 151. It is worth noting that the thickness of the oxide layer 153' covering the lower portion of the inner walls of the trench 151 barely becomes thinner because the polysilicon structure 160' in the lower portion of the trench 151 is not removed during the previous step.

Figure 4G:
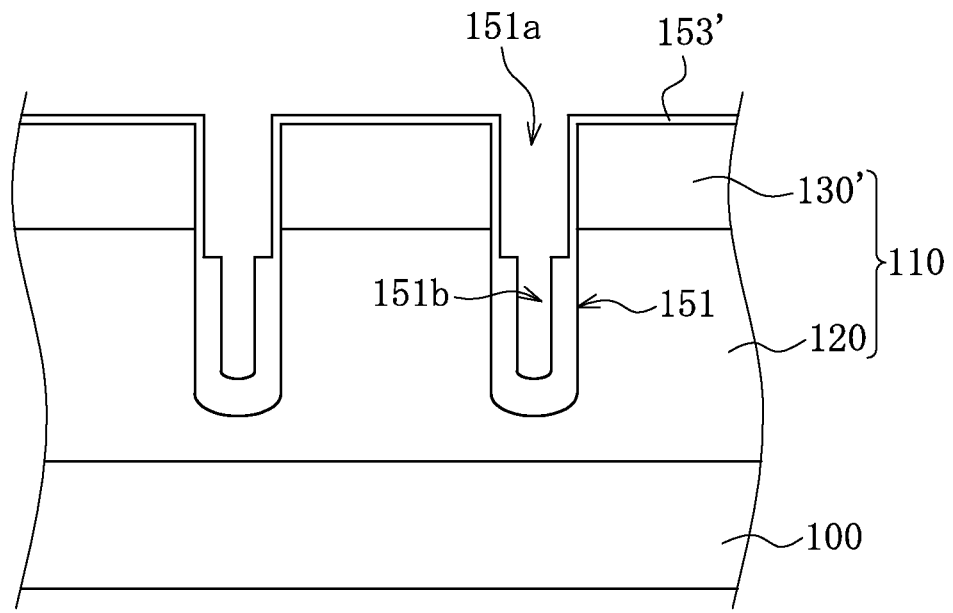

Subsequently, the residual polysilicon structure 160' in the trench 151 is removed, as shown in FIG. 4G. Meanwhile, the thicknesses of the oxide layer 153' respectively covering the upper and lower portions of the inner walls of the trench 151 are different so that an interior space at the inside of the trench can be divided into a larger first space 151a and a smaller second space 151b. The first space 151a is located above and in communication with the second space 151b. The step may be carried out by selectively etching to selectively remove the polysilicon structure 160' in the trench 151 without etching the oxide layer 153'.

Figure 4H:
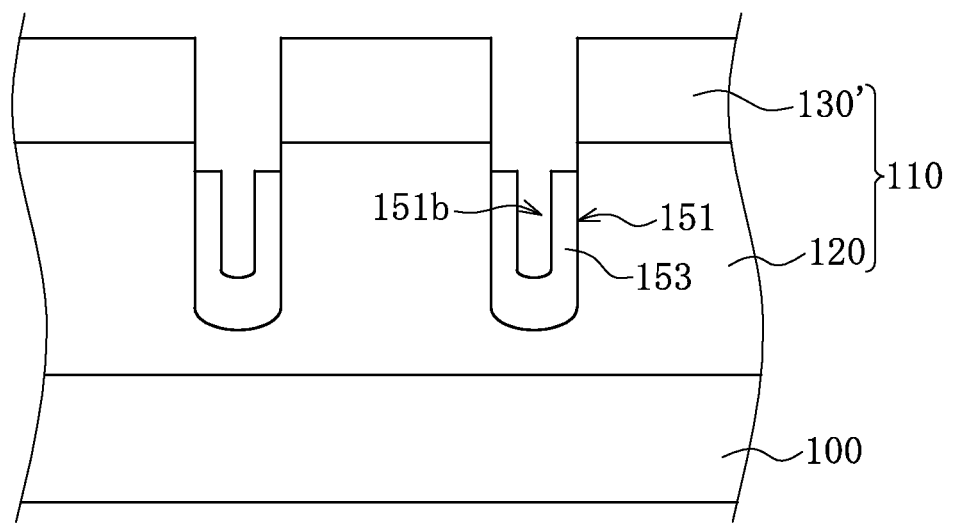

Please refer to FIG. 4H. The portion of the oxide layer 153' having thinner thickness is completely removed in this step. That is to say, a portion of the oxide layer 153' covering the surface of the epitaxial layer 110 and the upper portion of the inner walls of the trench 151 is completely removed. Notably, while this step is performed, the oxide layer 153' covering the lower portion of the inner walls of the trench 151 may also be slightly removed. However, the thickness of the oxide layer 153' covering the lower portion of the inner walls of the trench is thicker, even though the portion of the oxide layer 153' covering the upper portion of the inner walls of the trench 151 is removed, the other portion of the oxide layer 153' covering the lower portion of the inner walls of the trench 151 still can be remained.

Accordingly, in this step, the oxide layer covering the lower portion of the inner walls of the trench is the lower insulating layer 153 shown in FIG. 1A. Additionally, the top end of the lower insulating layer 153 is located at a level just below the lowest edge of the first doped region 130'.

Figure 4I:
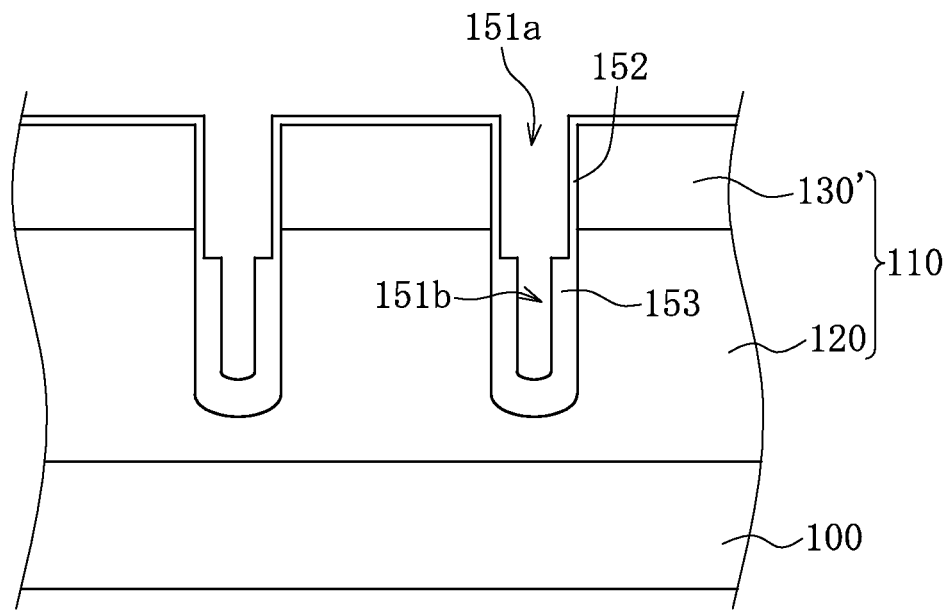

Please refer to FIG. 4I. An upper insulating layer 152 is formed above the oxide layer 153'. That is to say, the upper insulating layer 152 covers the upper portion of the inner walls of the trench 151 and the surface of the epitaxial layer 110. The process for forming the upper insulating layer 152 may be the same as that for forming the oxide layer 153' shown in FIG. 4C. For example, the upper insulating layer 152 and the oxide layer 153' may be formed by performing the thermal oxidation process.

In another embodiment, the process for forming the upper insulating layer 152 may be different from the process for forming the oxide layer 153' shown in FIG. 4C. In the embodiment of the present invention, the upper insulating layer 152 and the oxide layer 153' may have different thicknesses. The thickness of the upper insulating layer 152 is smaller than that of the oxide layer 153'. Additionally, the upper insulating layer 152 and the oxide layer 153' are mated with each other to form the insulating layer 154 as shown in FIG. 1A.

Figure 4J:
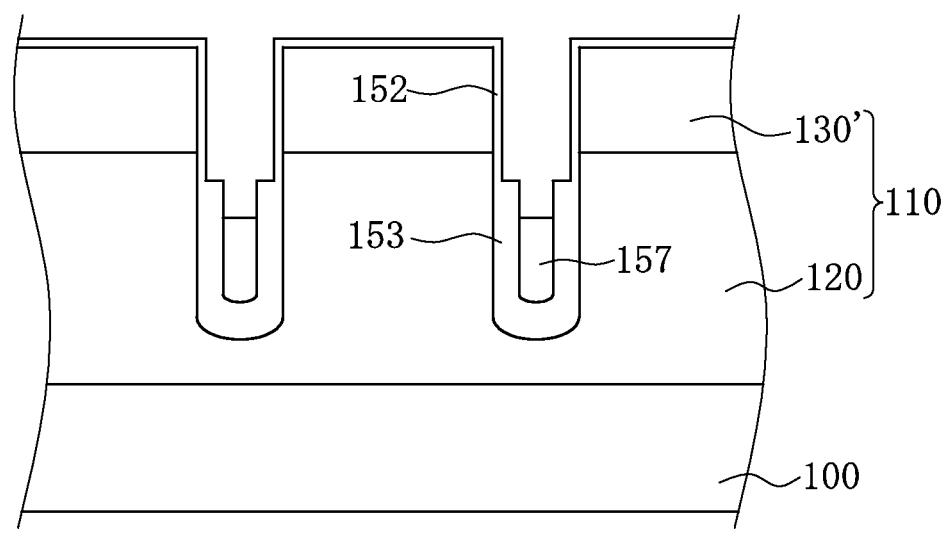
Figure 4K:
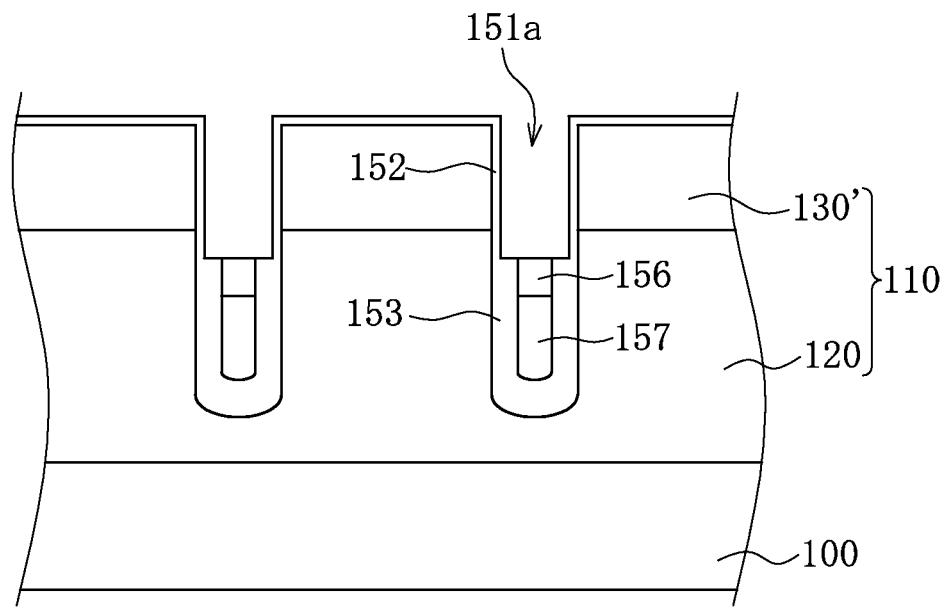
Figure 4L:
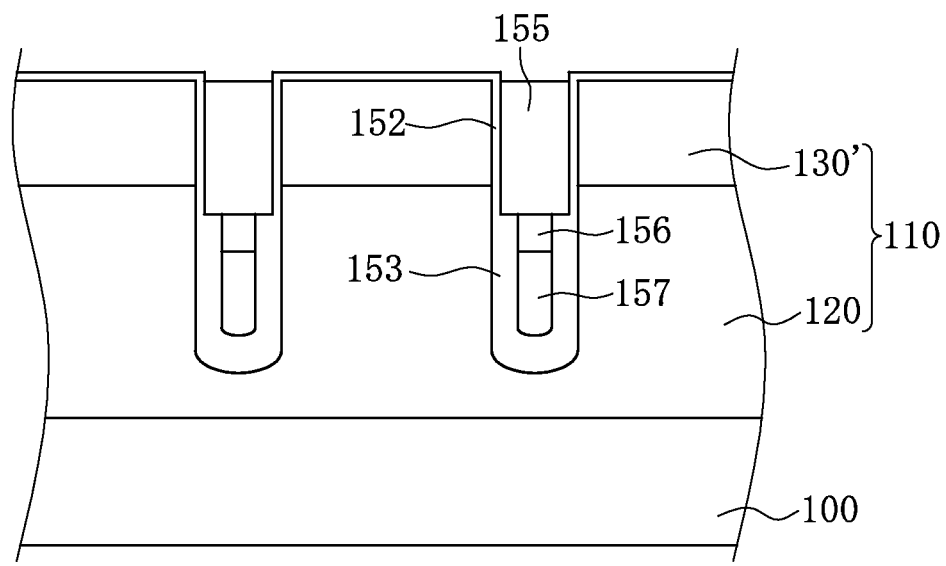

Please refer to FIGS. 4J to 4L. The gate 158 as shown in FIG. 1A is formed in the trench 151. The gate 158 includes an upper doped region 155, a middle region 156 and a lower doped region 157. The middle region 156 is interposed between the upper and lower doped regions 155 and 157 to form a junction capacitance (Cj) in the trench 151. Take the polysilicon gate as an example to describe the formation of the gate 158 as follows.

In the steps shown in FIGS. 4J to 4L, the lower doped region 157, the middle region 156, and the upper doped region 155 are sequentially formed in the trench 151. Additionally, a polysilicon structure is filled in the trench 151 and doped with second conductivity-type impurities to form the lower doped region 157. Meanwhile, the lower doped region 157 only fills a portion of the second space 151b, as shown in FIG. 4J.

Subsequently, an intrinsic semiconductor layer or a lightly-doped layer having the same conductive type as the lower doped region 157 is formed on the lower doped region 157 to form the middle region 156, as shown in FIG. 4K. Subsequently, as illustrated in FIG. 4L, another polysilicon structure is filled in the first space 151a of the trench 151, and doped with first conductivity-type impurities to form the upper doped region 155.

For example, during the fabrication of the N-type trench power MOSFET, the lower doped region 157 is doped with P-type conductivity impurities, such as boron ion, aluminum ion or gallium ion, and the upper doped region 155 is doped with N-type conductivity impurities, such as phosphorus ion or arsenic ion. The middle region 156 can be an intrinsic region or a P-type lightly-doped region. Conversely, during the fabrication of the P-type trench power MOSFET, the lower doped region 157 is doped with N-type conductivity impurities, and the upper doped region 155 is doped with P-type conductivity impurities. In addition, the middle region 156 can be an intrinsic region or an N-type lightly-doped region.

In the abovementioned embodiment, the middle region 156 can be lightly doped with the same conductivity type impurities, i.e., the second conductivity-type impurities, thus having the same conductivity type as that of the lower doped region 157. However, in another embodiment, during the steps of forming the gate 158, the middle region 156 can be doped with different conductivity type impurities, i.e., the first conductivity-type impurities, thus having the conductivity type reverse to that of the lower doped region 157.

Figure 4M:
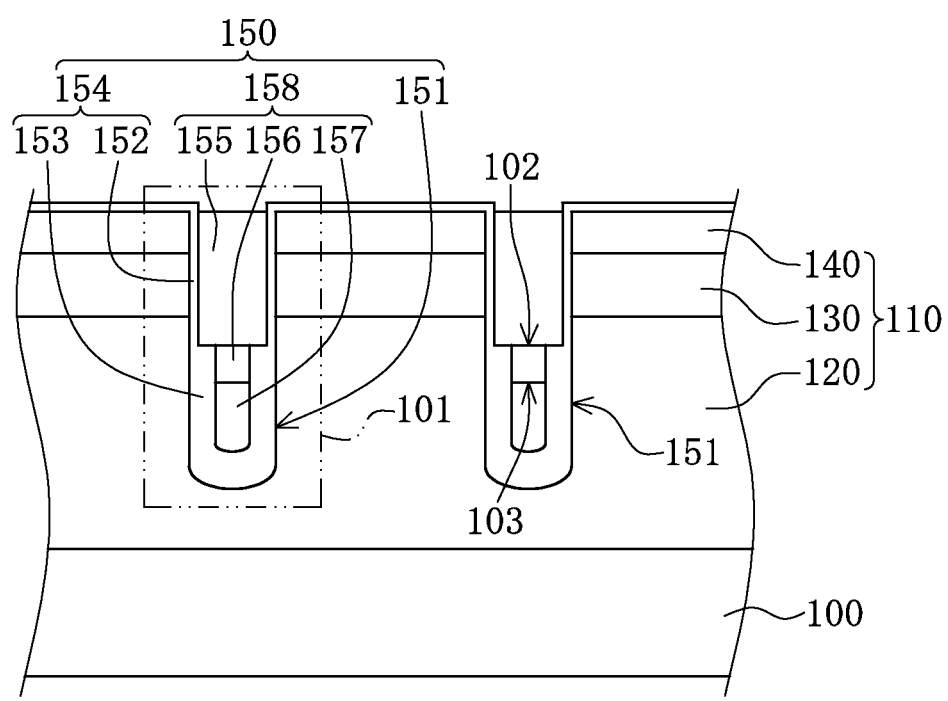

Subsequently, in step S104, a source implantation is performed to implant the first doped region 130' to form the source region 140 and the body region 130. The source region 140 is located above the body region 130, as shown in FIG. 4M. Specifically, after an ion implantation is performed to implant the first doped region 130', a thermal diffusion process is performed to respectively form the source region 140 and the body region 130.

In one embodiment, the lower doped region 157, the middle region 156, and the upper doped region 155 can be formed by an in-situ doping CVD process. However, in another embodiment, the formation of the upper and lower doped regions 155 and 157 may include the steps of forming a non-doped polysilicon structure, performing an ion implantation to the non-doped polysilicon structure and subsequently annealing the doped polysilicon structure.

That is, the lower doped region 157, the middle region 156, and the upper doped region 155 can be formed by any well-known technique and process sequences according to practical demands, and the present invention is not limited to the example provided herein.

For example, in another embodiment, the upper doped region 155 has a doping concentration with a gradient. That is, the doping concentration of the upper doped region 155 increases along a direction from near to the middle region 156 to far away from the middle region 156. Accordingly, the formation of the gate 158 can include the steps of forming the lower doped region 157 in the second space 151b of the trench 151 by an in-situ doping CVD process, forming non-doped polysilicon structure to fill the residual space (including the first space 151a and a part of the second space 151b) of the trench 151, subsequently, performing an ion implantation to the non-doped polysilicon structure and the first doped region 130', and subsequently performing a thermal diffusion process to form the source region 140, the body region 130, the middle region 156 and the upper doped region 155. By the aforementioned steps, the upper doped region 155 with the gradient doping concentration can be formed.

Please refer to FIGS. 5A to 5G. FIGS. 5A to 5G respectively show a schematic sectional view of the trench power MOSFET in different steps of the manufacturing method provided in accordance with another embodiment of the present invention. FIGS. 5A to 5F correspond to the step S103 shown in FIG. 3, and FIG. 5G corresponds to the step S104. In addition, before the steps shown in FIG. 5A, the steps respectively shown in FIGS. 4A and 4B are carried out, and the descriptions relative to the steps shown in FIGS. 4A and 4B are omitted herein. The same reference numerals are given to the same components or to components corresponding to previous embodiments.

Figure 5A:
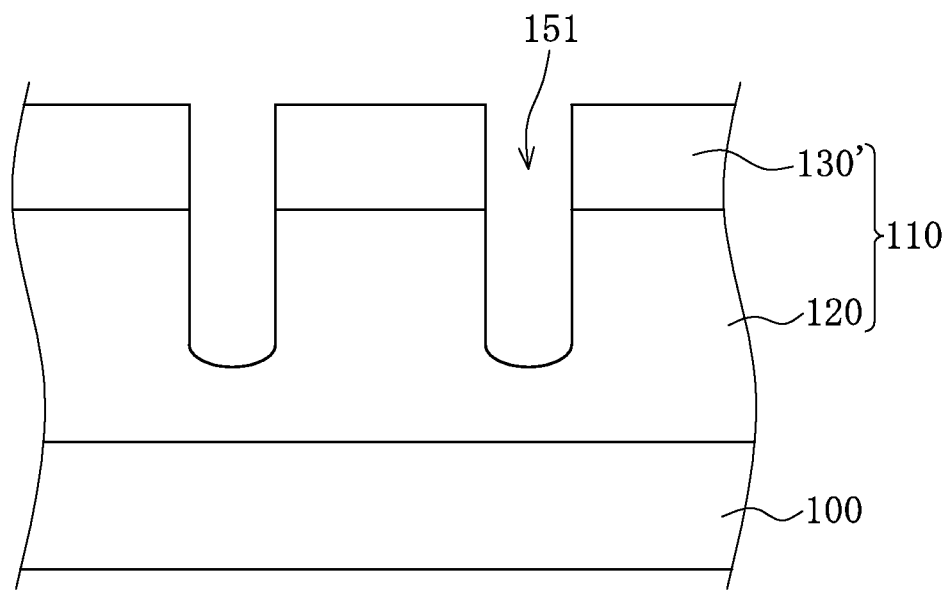
FIGS. 5A to 5G respectively show schematic sectional view of the trench power MOSFET in different steps of the manufacturing method provided in accordance with another embodiment of the present invention.
Figure 5B:
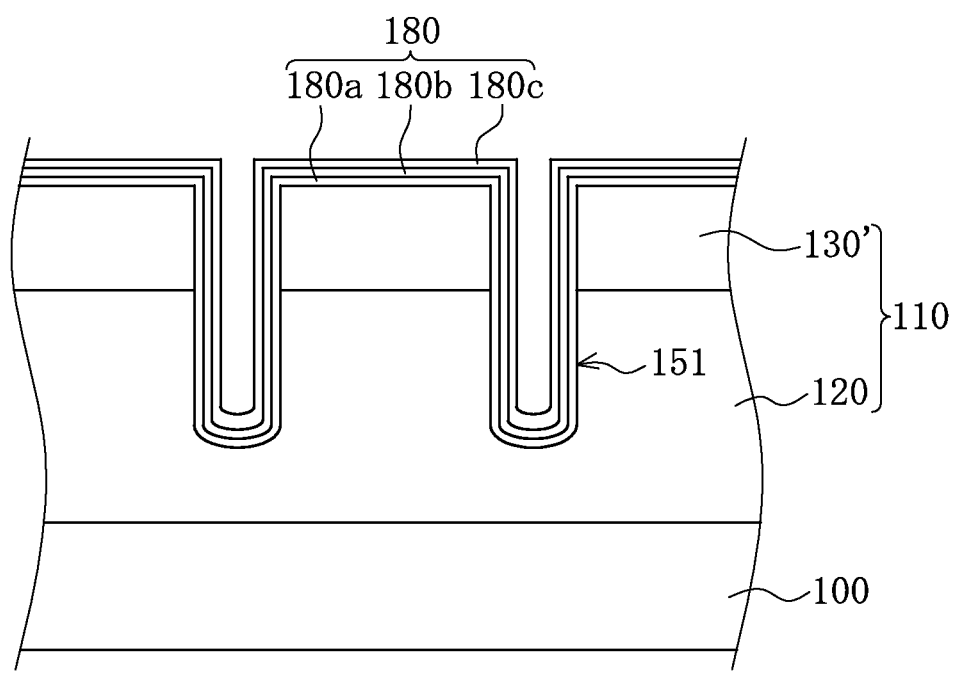

As shown in FIG. 5A, a plurality of trenches 151 is formed in the epitaxial layer 110. Subsequently, please refer to FIG. 5B, an insulating layer 180 is conformally formed on a surface of the epitaxial layer 110 and covers the inner walls and the bottom of each of the trenches 151 after the formations of the trenches 151. In the instant embodiment, the formation of the insulating layer 180 includes the steps of sequentially forming the first insulating layer 180a, the second insulating layer 180b and the third insulating layer 180c. That is to say, the second insulating layer 180b is sandwiched between the first insulating layer 180a and the third insulating layer 180c.

In one embodiment, both of the first insulating layer 180a and the third insulating layer 180c can be silicon dioxide layers, and the second insulating layer 180b can be a nitride layer. The first insulating layer 180a, the second insulating layer 180b and the third insulating layer 180c may be formed by thermal oxidation process or chemical vapor deposition (CVD).

Figure 5C:
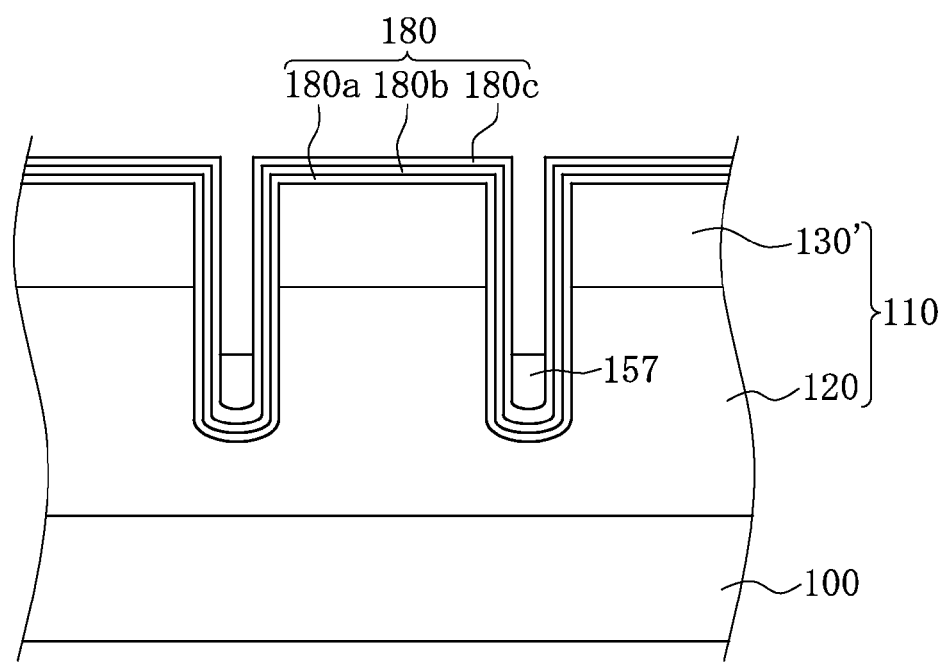

Subsequently, as shown in FIG. 5C, the lower doped region 157 is formed in the lower portion of the trench 151. Similar to the embodiment shown in FIG. 4J, the polysilicon structure can be formed and then doped with second conductivity-type impurities to form the lower doped region 157.

Figure 5D:
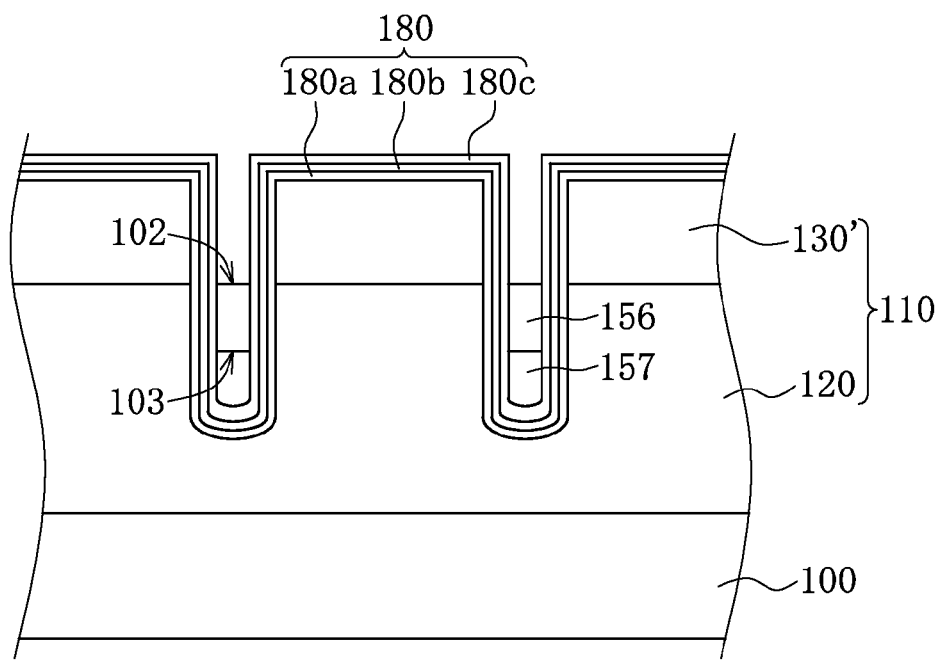

Subsequently, please refer to FIG. 5D, an intrinsic semiconductor layer or a lightly-doped layer is formed on the lower doped region 157 to form the middle region 156. In the instant embodiment, the first boundary 102 of the middle region 156 is located at a level below the lowest edge of the first doped region 130'. In one embodiment, the middle region 156 is formed by an in-situ doping CVD process.

Figure 5E:
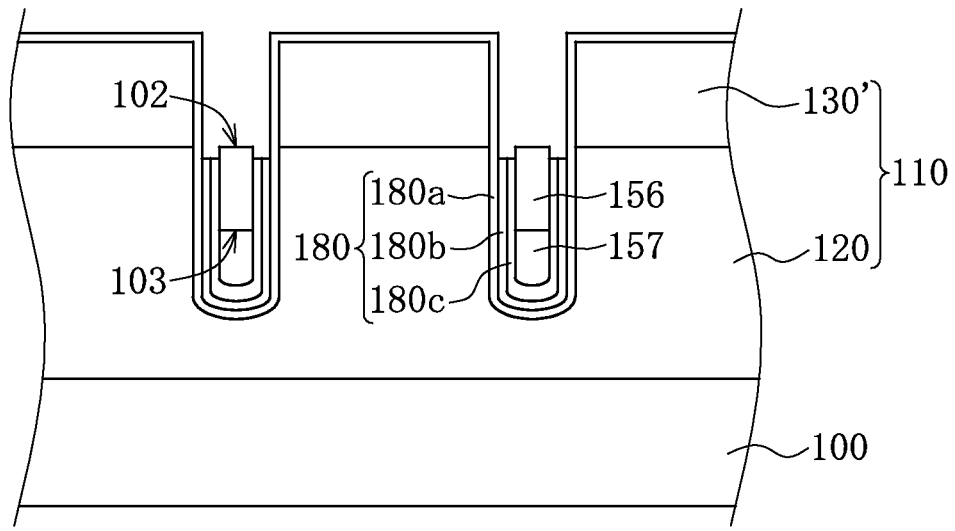

Subsequently, please refer to FIG. 5E, the second and third insulating layers 180b, 180c are partially removed by using the middle region 156 as a mask. Specifically, the second and third insulating layer 180b, 180c located above the first doped region 130' and covering the upper portion of the inner walls of the trench 151 are taken off. Only the portions of the second and third insulating layer 180b, 180c covering the lower portion of the inner walls of the trench 151 can be remained.

Notably, though the insulating layer 180 located in the lower portion of the trench 180 has a similar function to the lower insulating layer 153 shown in FIG. 1A, it has different structure from that of the lower insulating layer 153. The first insulating layer 180a covering the upper portion of the inner walls of the trench 151 has the same function and similar structure as the upper insulating layer 152 shown in FIG. 2. In the instant embodiment, the insulating layer 180 located at the lower portion of the trench 151 is used to serve as the lower insulating layer and has a nitride layer interposed therein, i.e., the second insulating layer 180b formed in the previous step is a nitride layer. As shown in FIG. 5E, the top ends of the second and third insulating layer 180b, 180c are located at a level just below the lowest edge of the first doped region 130'.

Figure 5F:
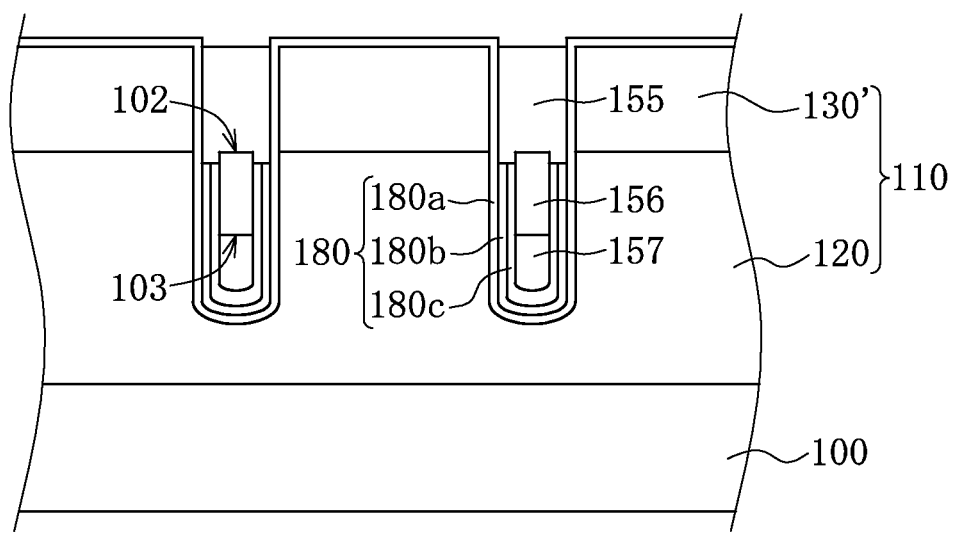

Thereafter, as shown in FIG. 5F, the upper doped region 155 is formed in the upper portion of each of the trenches 151 so that the middle region 155 is interposed between the upper and lower doped regions 155 and 157, thus resulting in a junction capacitance (Cj) in each of the trenches 151. In the instant embodiment, the upper doped region 155 is formed by an in-situ doping CVD process, but not so as to limit the scope of the invention.

Figure 5G:
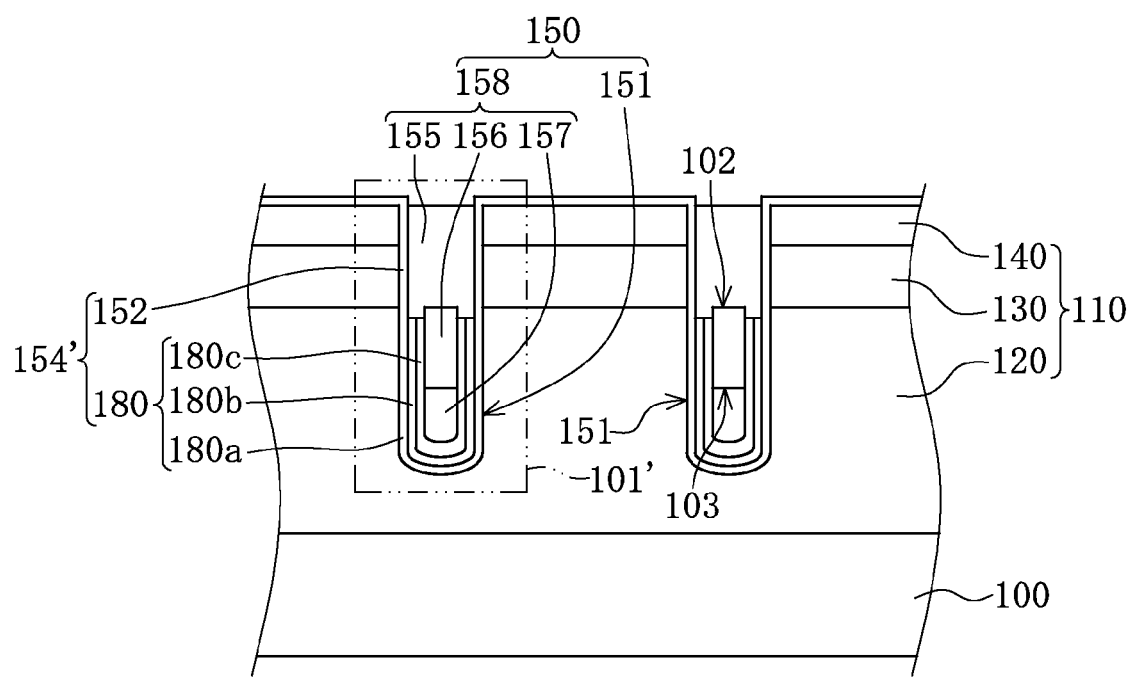

Subsequently, as shown in FIG. 5G, a source implantation is performed to implant the first doped region 130' to form the source region 140 and the body region 130. The source region 140 is located above the body region 130. Specifically, after an ion implantation is performed to implant the first doped region 130', a thermal diffusion process is performed to respectively form the source region 140 and the body region 130. According to the abovementioned embodiments, one of ordinary skill in the art can easily understand the other steps performed in the abovementioned embodiments in detail, and the relative descriptions are omitted herein.

In another embodiment, the fabrication of the upper doped region can include the steps of forming a non-doped polysilicon structure, and subsequently performing an ion implantation to implant a first doped region 130' and the non-doped polysilicon structure, and, thereafter, performing a thermal diffusion process to form the upper doped region 155 and the source region 140. The upper doped region 155 of the instant embodiment can have a doping concentration with a gradient. That is to say, by the abovementioned steps, the doping concentration of the upper doped region 155 gradually increases along a direction from near to the middle region 156 to far away from the middle region 156.

In summary, in the trench power MOSFET and the manufacturing method thereof in the embodiments of the present invention, a junction capacitance serially connected to the parasitic capacitance (Cp) can be formed in the gate. Since the PIN junction, the $P^-/N^+$ junction, or a $P^+/N^-$ junction has a larger depletion region than that in a PN junction, a lower junction capacitance (Cj) can be formed in the gate. In addition, the value of the junction capacitance (Cj) can be further lowered under a reverse bias because the depletion region is enlarged. Accordingly, after the junction capacitance is connected to the parasitic capacitance (Cp) in series, the gate-to-drain effective capacitance (Cgd) can be reduced. As such, during the operation of the power trench MOSFET, the switching speed of the device may increase due to the attenuation of the gate-to-drain effective capacitance (Cgd).

In the trench power MOSFET and the manufacturing method thereof in the embodiments of the present invention, a PN junction is formed in the gate. Since a junction capacitance (Cj) of the PN junction is generated under reverse bias, and the junction of capacitance is connected to the intrinsic gate-to-drain capacitance (Cgd) in series, the effective capacitance (Ct) can be reduced. As such, during the operation of the power trench MOSFET, the switching speed of the device may increase due to the attenuation of the effective capacitance.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A trench power MOSFET comprising:
   a substrate;
   an epitaxial layer formed on the substrate; and
   a plurality of trench transistor units formed in the epitaxial layer, wherein each of the trench transistor units includes
   a trench gate structure, comprising:
      a trench formed in the epitaxial layer, wherein an insulating layer is formed on an inner wall of the trench; and
      a gate filled in the trench, wherein the gate includes an upper doped region, a lower doped region and a middle region interposed therebetween, wherein the upper doped region has a conductive type reverse to a conductive type of the lower doped region, and the middle region has a carrier concentration smaller than that of each of the upper and lower doped regions;
   a source region, formed in the epitaxial layer and adjacent to side walls of the trench gate structure; and
   a body region, formed in the epitaxial layer under the source region and adjacent to side walls of the trench gate structure.

2. The trench power MOSFET according to claim 1, wherein the middle region has a first boundary between the upper doped region and the middle region, and the first boundary is located at a level equal to or below a lowest edge of the body region.

3. The trench power MOSFET according to claim 2, wherein both of the upper doped region and the source region are N-type, the lower doped region is P-type, and the middle region is an intrinsic region or a P-type lightly-doped region.

4. The trench power MOSFET according to claim 2, wherein both of the upper doped region and the source region are P-type, the lower doped region is N-type, and the middle region is an intrinsic region or an N-type lightly-doped region.

5. The trench power MOSFET according to claim 1, wherein a width of the upper doped region is wider than that of the lower doped region.

6. The trench power MOSFET according to claim 1, wherein the insulating layer includes an upper insulating layer and a lower insulating layer, the upper insulating layer is located above the lower insulating layer, and a thickness of the lower insulating layer is larger than a thickness of the upper insulating layer, wherein a top end of the lower insulating layer is located at a level lower than a lowest edge of the body region of the trench transistor unit.

7. The trench power MOSFET according to claim 1, wherein the insulating layer includes:
   an upper insulating layer isolating the upper doped region from the epitaxial layer; and
   a lower insulating layer isolating the lower doped region from the epitaxial layer, wherein the lower insulating layer has a nitride layer interposed therein, and a top end of the lower insulating layer is located at a level lower than a lowest edge of the body region of the trench transistor unit.

8. The trench power MOSFET according to claim 1, wherein a doping concentration of the upper doped region increases along a direction from near to the middle region to far away the middle region.

* * * * *